US008980026B2

(12) United States Patent
Ely

(10) Patent No.: US 8,980,026 B2
(45) Date of Patent: Mar. 17, 2015

(54) GAP SEALS FOR ELECTRONIC DEVICE STRUCTURES

(71) Applicant: Apple Inc., Cupertino, CA (US)

(72) Inventor: Colin M. Ely, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 187 days.

(21) Appl. No.: 13/631,675

(22) Filed: Sep. 28, 2012

(65) Prior Publication Data

US 2014/0090769 A1 Apr. 3, 2014

(51) Int. Cl.
*H05K 13/04* (2006.01)
*F16J 15/14* (2006.01)
*H05K 5/06* (2006.01)

(52) U.S. Cl.
CPC *H05K 5/062* (2013.01); *F16J 15/14* (2013.01)
USPC .......................................................... 156/83

(58) Field of Classification Search
CPC ........ B29C 65/14; H05K 13/04; H05K 5/062; F16J 15/14
USPC .............. 156/83, 267, 272.2, 272.8; 264/446, 264/261, 138
See application file for complete search history.

(56) References Cited

U.S. PATENT DOCUMENTS

| 511,278 | A | * | 12/1893 | Eichelberger | 213/132 |
|---|---|---|---|---|---|
| 7,652,892 | B2 | | 1/2010 | Shiu et al. | |
| 8,106,523 | B2 | | 1/2012 | Kanagawa et al. | |
| 8,252,408 | B2 | | 8/2012 | Uchida et al. | |
| 2005/0045272 | A1 | * | 3/2005 | McGlothlan | 156/267 |
| 2005/0085885 | A1 | * | 4/2005 | Janke et al. | 607/122 |
| 2007/0020814 | A1 | | 1/2007 | Hembree et al. | |
| 2007/0206365 | A1 | * | 9/2007 | Shiu et al. | 361/752 |
| 2008/0239022 | A1 | * | 10/2008 | Andrews et al. | 347/71 |
| 2010/0271825 | A1 | | 10/2010 | Black et al. | |
| 2011/0209890 | A1 | * | 9/2011 | Yamaguchi et al. | 174/50.5 |
| 2012/0081875 | A1 | | 4/2012 | Yamaguchi et al. | |

* cited by examiner

*Primary Examiner* — Daniel McNally
(74) *Attorney, Agent, or Firm* — Treyz Law Group; G. Victor Treyz; Kendall P. Woodruff

(57) ABSTRACT

An electronic device may have structures such as housing structures, display structures and other device structures that form gaps when assembled. To prevent intrusion of moisture and other environmental contaminants, the gaps may be filled using gap sealing material. The gap sealing material may be a liquid polymer that is applied to the gap in a way that creates an excess protruding portion. Light-based processing techniques and application of solvent may be used to remove excess material. A sealing material such as an adhesive may be applied to gaps to forming a sealing structure. A material may be applied to the adhesive sealing material to cause the sealing material to expand and fill the gap. An undersized gasket may be placed in a gap. The gasket may include materials such as polymer that expands upon application of moisture.

22 Claims, 12 Drawing Sheets

GAP SEALS FOR ELECTRONIC DEVICE STRUCTURES

BACKGROUND

This relates to electronic devices and, more particularly, to gap sealing structures for electronic devices.

Electronic devices such as cellular telephones and other portable devices are often provided with gaskets. For example, an elastomeric gasket may be used to seal a display cover glass layer to an electronic device housing. The use of the elastomeric gasket helps ensure that dust, moisture, and other environmental contaminants do not enter the interior of a device through gaps between device structures. Keeping the interior of a device free of contaminants may help prevent damage to internal device components.

It can be challenging to effectively seal device structures using conventional gasket structures. Conventional gaskets can be prone to shearing damage when a glass layer in a display is installed in a device housing. Conventional gaskets are also compressed to fit into a gap to create a seal. If a gasket is not sufficiently large, a poor seal will be formed, allowing environmental contaminants to harm device components. If a gasket is too large, however, it may be difficult to overcome the forces produced by the gasket when assembling device structures together. Compressed gasket restoring forces may also adversely affect device reliability.

It would therefore be desirable to be able to provide improved gap sealing structures for electronic devices.

SUMMARY

An electronic device may have structures such as housing structures, display structures, and other device structures that form gaps when assembled. To prevent intrusion of moisture and other environmental contaminants, the gaps may be filled using gap sealing material.

Gap seals may be formed from undersized structures or liquids to facilitate assembly.

A gap sealing material may, for example, be applied to the gap so as to create an excess protruding portion. Laser processing techniques and application of solvent may be used to remove the excess protruding portion of the gap sealing material.

A sealing material such as a liquid adhesive may be applied to gaps to forming a sealing structure. A material such as water or other liquid may be applied to the sealing material to cause the sealing material to expand and fill the gap.

An undersized gasket may be placed in a gap. The gasket may include materials such as polymer fibers that expand upon application of a liquid.

Further features of the invention, its nature and various advantages will be more apparent from the accompanying drawings and the following detailed description of the preferred embodiments.

DETAILED DESCRIPTION

Electronic devices may have gaps. For example, an electronic device may have display structures, connector structures, housing structures, and other device structures that are separated from each other by gaps. Gaps such as these may be filled using sealing structures such as gaskets and other structures formed from sealing materials such as polymers.

Figure 1:
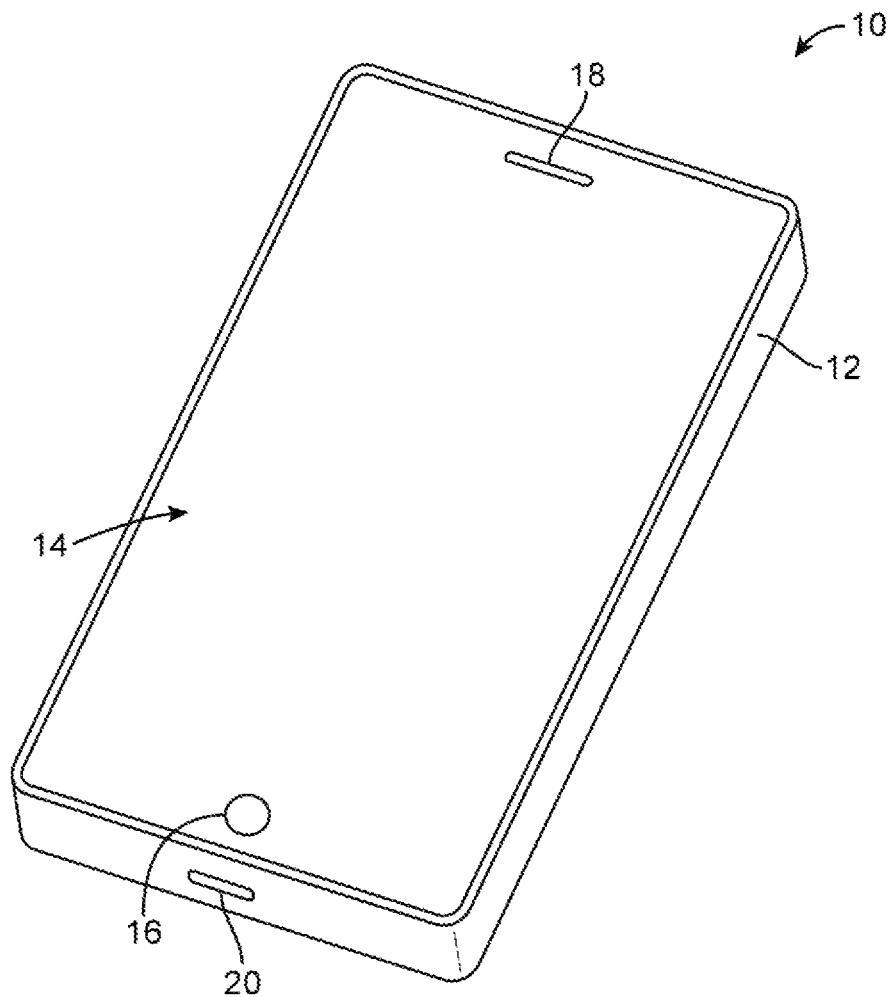
FIG. 1 is a front perspective view of an illustrative electronic device of the type that may be provided with gap sealing structures in accordance with an embodiment of the present invention.

An illustrative electronic device of the type that may be provided with a sealing structure to seal gaps in device structures is shown in FIG. 1. Device 10 of FIG. 1 may be a handheld device such as a cellular telephone or media player, a tablet computer, a notebook computer, other portable computing equipment, a wearable or miniature device such as a wristwatch or pendant device, a television, a computer monitor, or other electronic equipment.

As shown in FIG. 1, electronic device 10 may include a display such as display 14. Display 14 may be a touch screen that incorporates a layer of conductive capacitive touch sensor electrodes or other touch sensor components or may be a display that is not touch-sensitive. Display 14 may include an array of display pixels formed from liquid crystal display (LCD) components, an array of electrophoretic display pixels, an array of electrowetting display pixels, or display pixels based on other display technologies.

Display 14 may be protected using a display cover layer such as a layer of transparent glass or clear plastic. Openings may be formed in the display cover layer. For example, an opening may be formed in the display cover layer to accommodate a button such as button 16 and an opening such as opening 18 may be used to form a speaker port. Device configurations without openings in display 14 may also be used for device 10.

Device 10 may have a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Openings may be formed in housing 12 to accommodate sensors, buttons, connectors, and other components such as connector 20 of FIG. 1.

Housing 12 may be formed using a unibody configuration in which some or all of housing 12 is machined or molded as a single structure or may be formed using multiple structures (e.g., an internal frame structure, one or more structures that form exterior housing surfaces, etc.).

Figure 2:
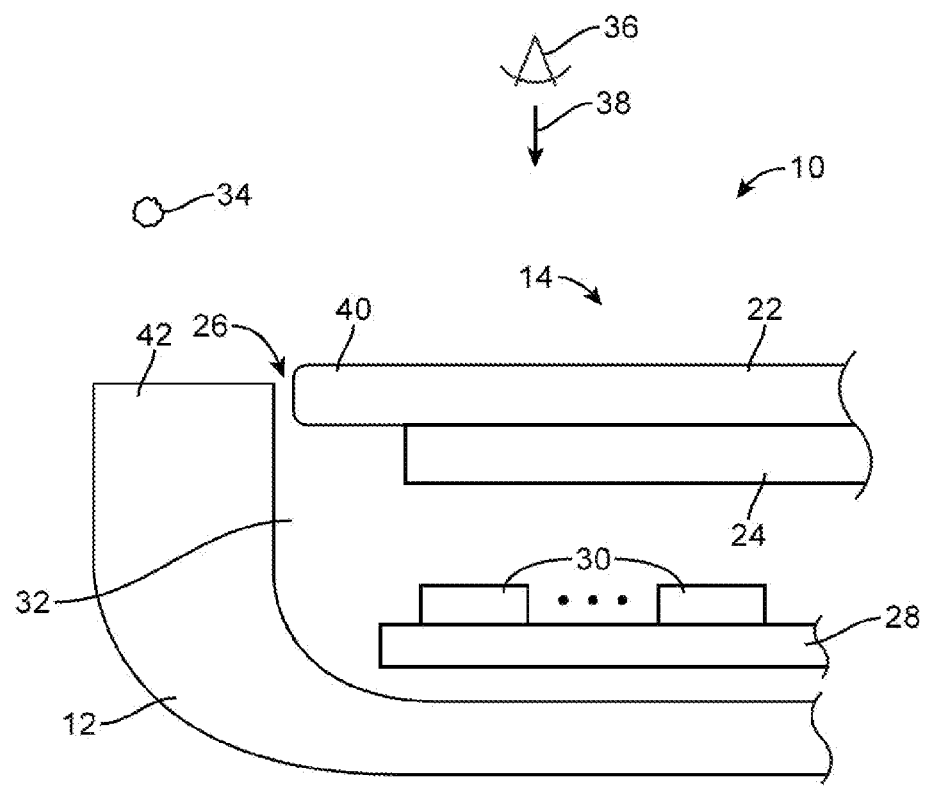
FIG. 2 is a cross-sectional side view of an illustrative electronic device with a gap of the type that may be filled using gap sealing structures in accordance with an embodiment of the present invention.

A cross-sectional side view of a portion of an electronic device of the type that may have gaps between device structures is shown in FIG. 2. As shown in FIG. 2, device 10 may have display such as display 14. Display 14 may include display structures 24 such as a liquid crystal display module, an organic light-emitting diode array, electrophoretic display structures, electrowetting display structures, or other display structures for producing images for a user of device 10 such as viewer 36 viewing display 14 in direction 38. Display structures 24 may, if desired, be covered with a protective layer such as display cover layer 22. Display cover layer 22 may be a planar sheet of glass, a layer of clear plastic, or other transparent display structure. If desired, a color filter layer or other layer in display structures 24 may serve as the outermost layer of display 14. The illustrative configuration of FIG. 2 in which display 14 has a separate cover layer such as display cover layer 22 is merely illustrative.

Internal components 30 may be mounted in interior 32 of housing 12. Internal components 30 may be interconnected using traces on printed circuits, wires, cables, and other conductive paths. As an example, components 30 may be interconnected using conductive traces in substrate 28. Substrate 28 may be a printed circuit such as a rigid printed circuit board (e.g., a printed circuit board formed from fiberglass-filled epoxy or other dielectric material), a flexible printed circuit formed from a sheet of polyimide or other flexible layer of polymer, a rigid flex circuit that includes both rigid and flexible printed circuit areas, a plastic carrier, a glass or ceramic substrate, or other dielectric substrate. Internal components 30 may include switches, sensors, integrated circuits, connectors, discrete components such as capacitors, inductors, and resistors, status indicator lights, vibrators, tone generators, audio components such as speakers and microphones, battery structures, and other circuitry.

During operation of device 10, external contaminants such as contaminant 34 may be present around the exterior of device 10. Gaps such as gaps 26 may be formed between device structures. In the FIG. 2 configuration, for example, gap 26 has been formed between portion 40 of display cover layer 22 and opposing portion 42 of housing 12. Gaps such as gap 26 may present a pathway for moisture, dust, and other external material 34 to enter interior portion 32 of device 10. To prevent external material 34 from entering interior portion 32, device 10 may be provided with sealing structures. The sealing structures may seal housing portion 42 to display portion 40 or may seal other adjacent device structures to each other, thereby sealing interior 32 from the exterior of device 10.

Figure 3:
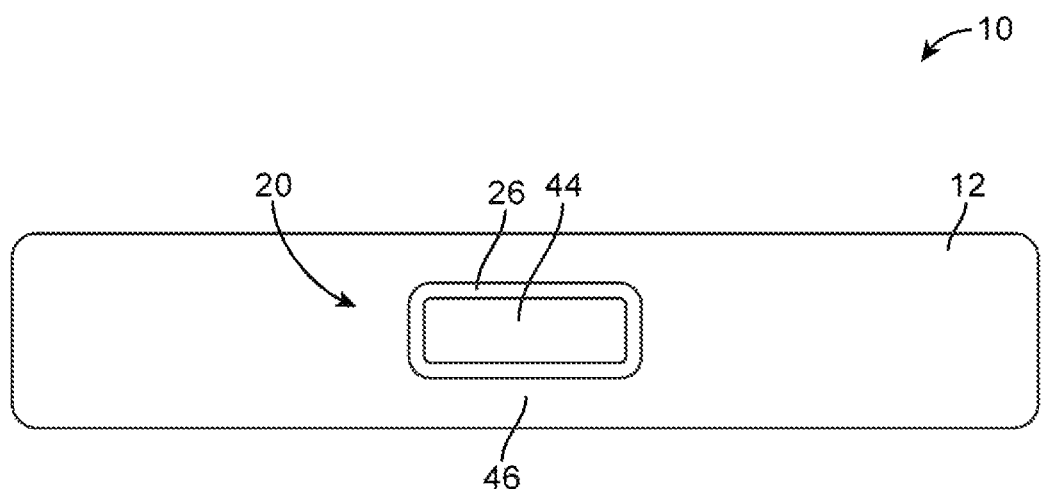
FIG. 3 is an end view of an illustrative electronic device with a connector-to-housing gap that may be filled using gap sealing structures in accordance with an embodiment of the present invention.

In the example of FIG. 2, the device structures that are being sealed from each other included housing 12 and display structures such as display cover layer 22 in display 14. This is merely illustrative. In general, gaps between any opposing device structures may be sealed. As shown in FIG. 3, for example, a gap such as gap 26 may be formed in association with connector 20 (e.g., a gap such as gap 26 may be formed between connector structures 44 and surrounding portions of housing 12 such as housing portion 46). Environmental contamination in the vicinity of connector 20 can be prevented from reaching interior 32 of device 10 using a sealing structure that surrounds the periphery of connector 20 in gap 26.

Figure 4:
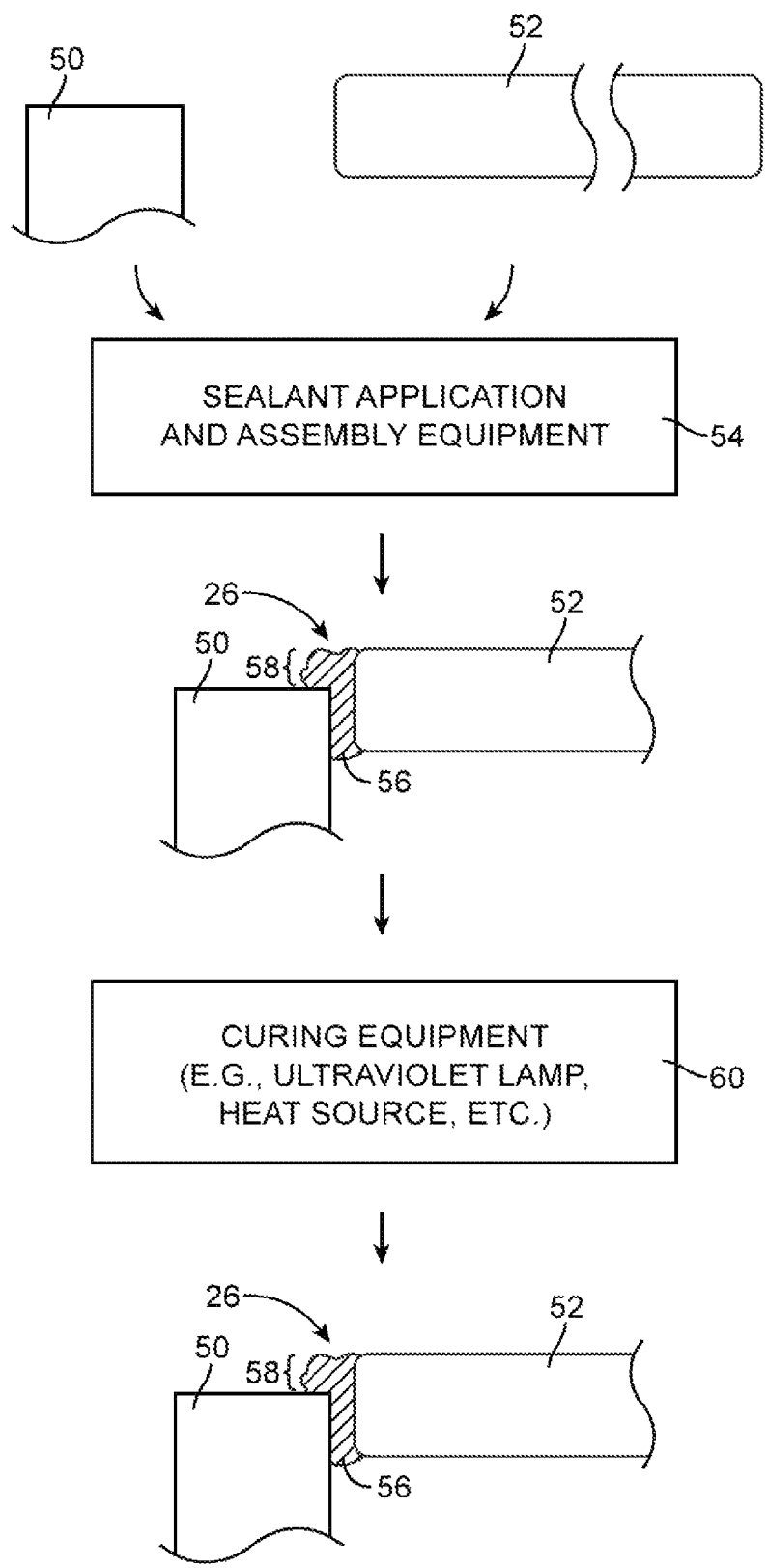
FIG. 4 is a diagram showing how gaps in device structures may be filled using a sealing material in accordance with an embodiment of the present invention.

Sealing structures for device 10 may be formed by applying sealant to gap 26. As shown in FIG. 4, sealant application and assembly equipment such as equipment 54 may be used to assemble device structures such as structures 50 and 52 and may be used in applying sealing material 56 in a gap such as gap 26 between structures 50 and 52. Structures 50 and 52 may be housing structures, portions of display 14, connector structures associated with connectors such as connector 20, or other suitable portions of device 10. As an example, structure 50 may be formed from housing 12 and structure 52 may be formed from display cover layer 22 (FIG. 2). Other device structures may be assembled using equipment 54 if desired. The sealing of a housing structure to a display cover layer or other display structure is merely an illustrative example.

Sealing material 56 may be a liquid (e.g., a liquid polymer such as a liquid adhesive), ultraviolet-light-curable adhesive such as ultraviolet-light-curable epoxy, thermally curable epoxy, or other liquid or polymer material for sealing gap 26 between device structures 50 and 52. Sealing material application equipment 54 may include equipment for spraying liquid sealing material 56 on device structure, equipment for applying sealing material 56 from a nozzle, equipment for applying sealing material 56 using dipping, pad printing, ink-jet printing, screen printing, or painting techniques, or for applying sealing material 56 using other material application techniques. Computer-controlled positioners may, if desired, be used in applying sealing material 56 to gap 26 (e.g., computer-controlled positioners may be used to position nozzles and other material application tools). If desired, assembly equipment in equipment 54 may include computer-controlled positioners for positioning device structures 50 and 52 relative to each other. Sealing material application operations and device structure assembly operations may also be performed manually. Following application of sealing material 56 to gap 36 between device structures 50 and 52, an excess portion of sealing material 56 such as portion 58 may protrude from gap 26, as shown in FIG. 4.

Sealing material 56 may cure at room temperature. For example, sealing material 56 may cure at room temperature as a result of exposure to air or as part of a two-part adhesive curing process. If desired, optional curing equipment 60 may be used to facilitate the curing of sealing material 56. Sealing material 56 may, for example, be an ultraviolet-light-curable adhesive such as ultraviolet-light-curable epoxy. Curing equipment 60 may include an ultraviolet light source such as an ultraviolet lamp, an ultraviolet light laser, or an ultraviolet light-emitting diode. Application of ultraviolet light to ultraviolet-light-curable sealing material may help cure material 56. The curing of material 56 may also be facilitated by applying heat to material 56 (e.g., using an oven, a heat lamp, a heat gun, a hot bar, or other source of heat).

Protruding portion 58 of sealing material 56 may be unsightly to users viewing the exterior of device 10. Excess portions of sealing material 56 such as protruding portion 58 may therefore be removed using material removal equipment such as machining equipment, a cutting blade, or other equipment for removing excess material 56. As an example, light-based material removal equipment may be used in removing protruding excess sealing material 58.

Figure 5:
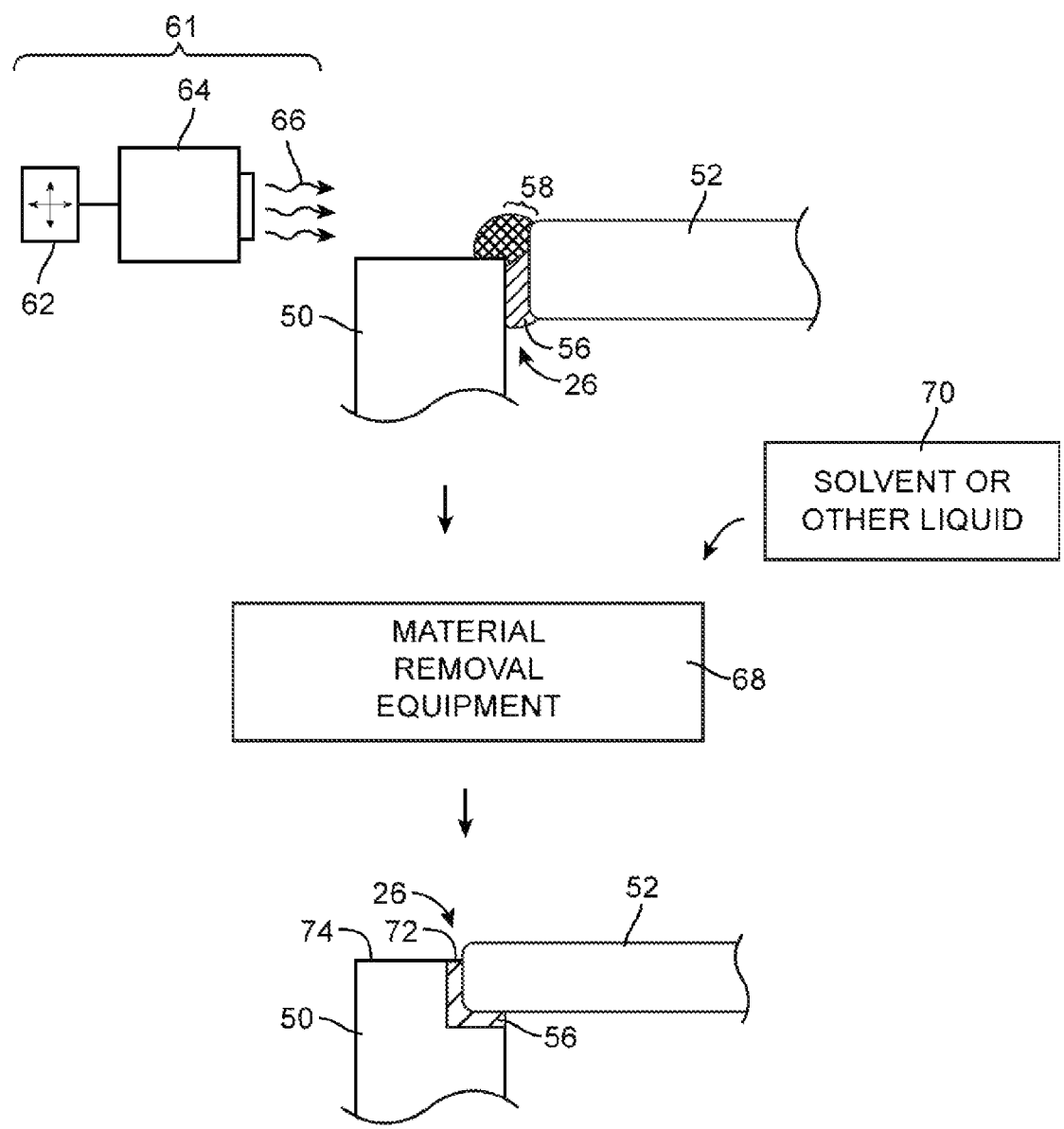
FIG. 5 is a diagram showing how material removal techniques such as laser processing techniques or other light-based processing techniques may be used in removing excess sealing material from gap sealing structures in accordance with an embodiment of the present invention.

A light-based system such as a laser-based system for removing excess sealing material 58 is shown in FIG. 5. As shown in FIG. 5, light-based processing equipment such as laser processing equipment 61 may include a lamp, light-emitting diode, or other light source such as laser 64. Laser 64 (or other light source) may generate light such as laser beam 66. An optical system such as a system of mirrors and lenses may be used to focus laser beam 66 on excess protruding portion 58 of sealing material 56. The presence of structures such as housing 12 or supplement structures that are provided as part of system 61 may also shadow some of light 66. Through control of the focus of light beam 66 and/or by creating shadows, the extent to which light beam 66 penetrates into gap 26 can be limited to ensure that none of the material in gap 26 is exposed to light 66.

As shown in FIG. 5, computer-controlled positioning equipment such as equipment 62 may be used in positioning laser 64, the optical system of mirrors and lenses used to distribute beam 66 to material 58, and/or structures 50 and 52 so that beam 66 focuses on excess portion 58 of sealing material 56 without significantly affecting material 56 in gap 26. Laser light 66 may be, for example, ultraviolet light that chemically alters portion 58 of sealing material 56 (e.g., by breaking chemical bonds within material 56). If desired, light 66 may include other wavelengths of light (e.g., visible light and/or infrared light) and/or may be light produced by a lamp, light-emitting diode, or other source. Laser 64 may produce continuous wave (CW) laser light 66 or pulsed laser light 66. If desired, portion 58 may be subjected to thermal decomposition upon application of laser light 66.

After applying light 66 to portion 58 of sealing material 56 to break chemical bonds and/or thermally decompose or otherwise alter the material properties of portion 58, material removal equipment 68 may be used in removing portion 58 from structures 50 and 52. Solvent 70 may facilitate removal of portion 58. Equipment 68 may include manual equipment such as manually manipulated cloth or brushes and/or may include automated equipment such as computer-positioned equipment with brushes or other wipers for wiping away portion 58. Solvent 70 may include alcohol (e.g., isopropyl alcohol, ethanol, methanol, etc.), acetone, trichloroethylene, other organic solvents, water, or other liquids for facilitating the removal of portion 58 of sealing material 56 after laser exposure. Equipment 68 may apply solvent 70 to material 58 while wiping material 58 using a cloth, while wiping material 58 using a rotating wheel, or while otherwise physically contacting material 58 to facilitate material removal. Solvent 70 may help soften and loosen material 58. The presence of solvent 70 and the chemical changes induced in the material of portion 58 by application of laser light 66 help effectively remove excess protruding portion 58 of sealing material 26 when physically manipulated by equipment 68 without disturbing or removing material 56 in gap 26 that was not exposed to laser light 66.

If desired, equipment 68 may apply a liquid such as a solvent, a gas such as oxygen, or other material to material 58 to facilitate removal of material 58 without pre-applying light 66. As an example, glue or other material 56 may be applied to gap 26 to produce 400 microns of adhesive in gap 26 and 30 microns of overflow 58 (as just one example). Using a solvent or other material, equipment (e.g., a computer-controlled wiper, gas chamber, or other equipment) may remove the glue or other material 56 at a constant rate. For example, equipment 68 may uniformly remove 50 microns of material 56, leaving a seal in gap 26 that is 350 microns thick (as an example).

Following removal of portion 58 of sealing material 56, gap 26 may be filled and therefore sealed by remaining material 56. Exposed surfaces of material 56 such as surface 72 may lie flush with nearby portions of structures 50 and 52. For example, portion 72 of sealing material 56 in gap 26 may lie flush with surfaces of structures 50 such as surface 74, thereby enhancing the appearance of device 10. Because sealing material 56 was formed from a liquid material, sealing material 56 will not generate restoring forces of the type that may be experienced when a structure such as an elastomeric gasket is compressed between adjoining device structures. This reduction in restoring forces may enhance the reliability of the seal of gap 26.

Figure 6:
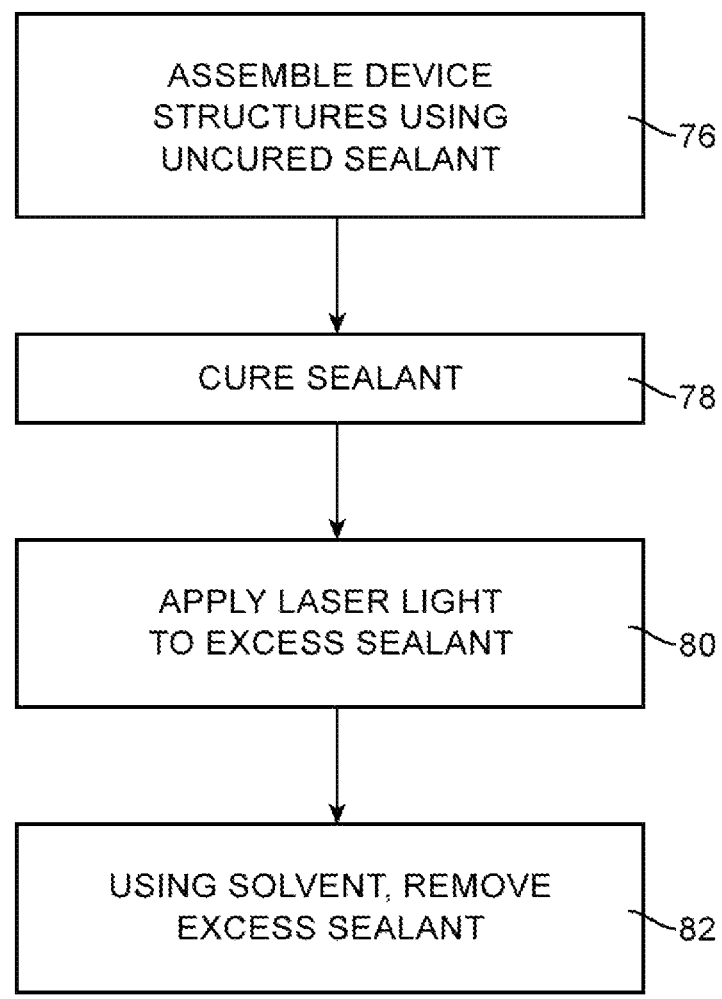
FIG. 6 is a flow chart of illustrative steps involved in using laser processing techniques to help trim excess sealing material from gap sealing structures in an electronic device in accordance with an embodiment of the present invention.

Illustrative steps involved in using a system of the type shown in FIG. 5 in sealing device gaps such as gap 26 are shown in FIG. 6. At step 76, device structures in device 10 may be assembled using uncured sealing material (e.g., liquid polymer adhesive) such as material 56 of FIG. 4. Equipment such as sealant application and assembly equipment 54 may be used to assemble the device structures and uncured sealing material 56. Sealing material 56 and device structures such as structures 50 and 52 may be assembled so that sealing material 56 fills gap 26 while creating an excess portion such as portion 58. Sealing material 56 may be added to gap 26 after structures 50 and 52 have been assembled or may be applied to structures 50 and/or 52 before structures 50 and 52 are assembled. Structures 50 and 52 may be assembled as part of a complete or nearly complete version of device 10 or may form a subassembly that is later joined with other device structures to form device 10.

At step 78, equipment such as equipment curing equipment 60 of FIG. 4 may optionally be used to apply light or heat to sealing material 56 to facilitate curing of material 50.

At step 80, laser processing equipment such as laser processing equipment 61 of FIG. 5 may be used to apply laser beam 66 to excess portions of sealing material 56 that are visible from the exterior of device housing 12 such as protruding excess portion 58 of sealing material 56. The laser light that is applied to portion 58 may break chemical bonds within material 56 or may otherwise alter the material properties of material 56 so that material 56 is prepared for removal using solvent.

At step 82, material removal equipment 68 (FIG. 5) may apply solvent 70 or other liquid to material 58 while mechanically rubbing, spraying, or otherwise wiping and cleaning material 58 away from sealing material 56 in gap 26. Following removal of excess material 58, sealing material 56 that remains in gap 26 may seal gap 26 without exposing unsightly excess material to view by a viewer such as viewer 36 of FIG. 2.

Figure 7:
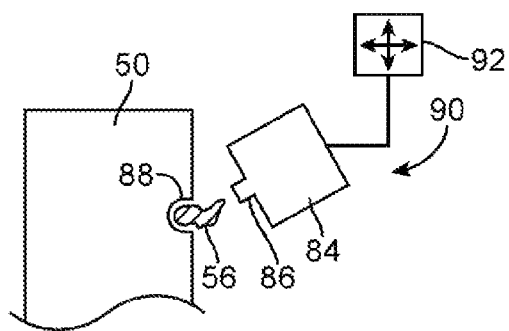
FIG. 7 is a diagram of sealant dispensing equipment being used to apply sealant material to an electronic device structure in accordance with an embodiment of the present invention.

If desired, liquid or other materials may be used to cause sealing material 56 to swell within gap 26, thereby helping to effectively seal gap 56. As shown in FIG. 7, for example, equipment such as sealing material application equipment 90 may be used to apply sealing material 56 to electronic device structures 50 (e.g., housing 12, etc.). Sealing material 56 may be a liquid polymer such as an ultraviolet-light-curable adhesive, a two-part adhesive, or a thermally curable adhesive (as examples). Equipment 90 may include a computer-controlled positioner such as positioner 92 to move sealing material reservoir 84 and dispensing nozzle 86 relative to structures 50. Structures 50 may, if desired, include recesses such as ledges, notches, and other openings to receive sealing material 56, as shown by illustrative recess 88 of FIG. 7.

Figure 8:
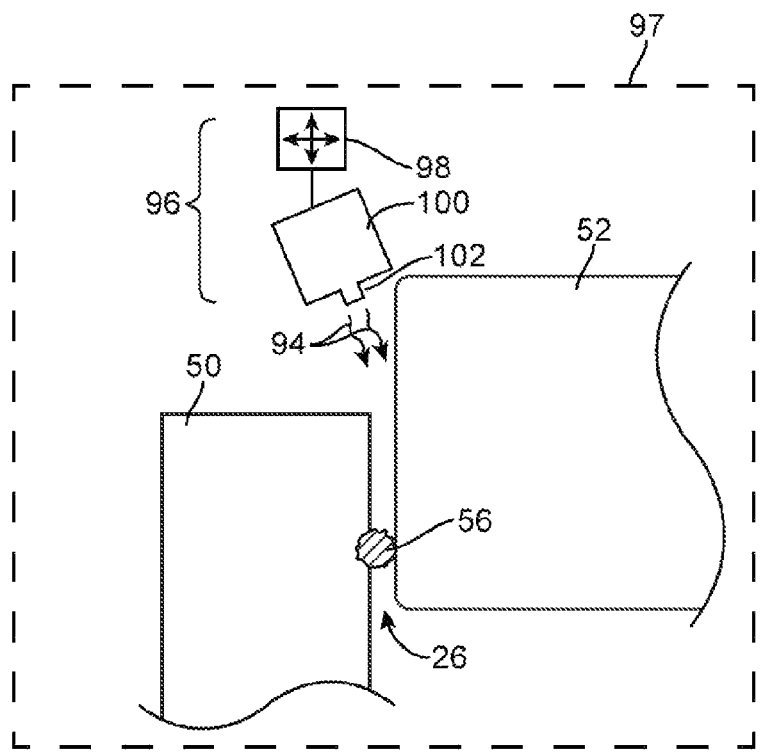
FIG. 8 is a diagram of equipment being used to apply moisture or other material to the sealant of FIG. 7 to cause the sealant to swell in accordance with an embodiment of the present invention.

Following application of sealing material 56 to electronic device structures 50, device structures 50 and 52 may be assembled to form gap 26, as shown in FIG. 8. Sealing material 56 may at least partly fill gap 26. To cause material 56 to swell and thereby completely fill gap 26, material 94 can be applied to sealing material 56 by equipment 96. Material 94 may be water or other liquids that can cause sealing material 56 to expand. If desired, material 94 may be a gas, steam, or other material that is applied o material 56 in the interior of chamber 97. Sealing material 56 may be polyurethane adhesive or other material that expands upon contact with moisture (as an example). Equipment 96 may include a computer-controlled positioner such as positioner 98 to move liquid reservoir 100 and dispensing nozzle 102 relative to structures 50 and 52. Chamber 97 may include a sealed interior and sources of steam, oxygen, other gases, or other materials for causing material 56 to swell.

Figure 9:
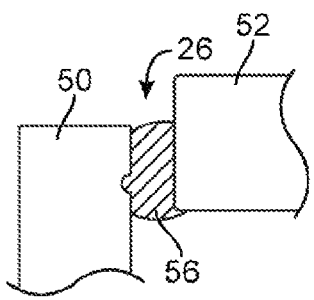
FIG. 9 is a cross-sectional side view of electronic device structures in which a gap has been sealed by swelling sealant in accordance with an embodiment of the present invention.

Following application of liquid 94 to sealing material 56, sealing material 56 may swell to fill gap 26, as shown in FIG. 9. Excess material may be trimmed using a laser-based system as described in connection with FIGS. 5 and 6.

Figure 10:
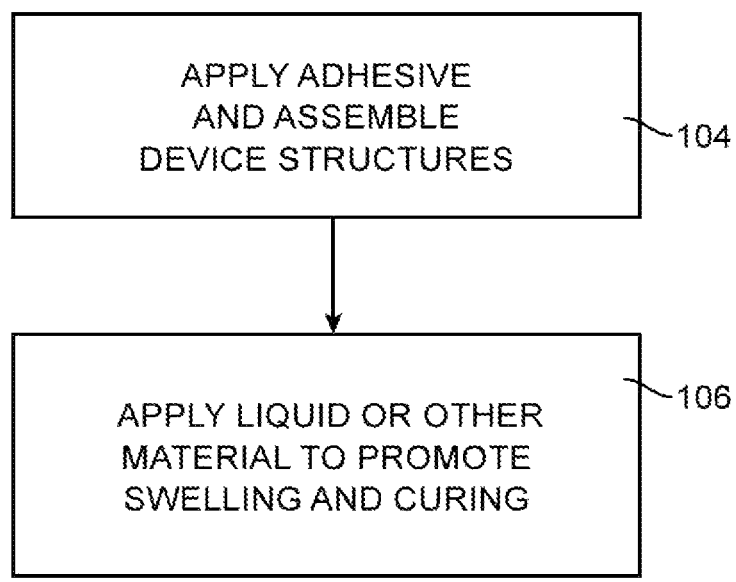
FIG. 10 is a flow chart of illustrative steps involved in using liquid or other material to promote sealant swelling to seal gaps in electronic device structures in accordance with an embodiment of the present invention.

Illustrative steps involved in sealing gap 26 between device structures 50 and 52 of FIG. 9 using sealing material that expands when a material such as water is applied are shown in FIG. 10.

At step 104, equipment 90 may be used to apply an adhesive or other sealing material 56 to structures 50. Assembly equipment (e.g., computer-controlled positioners) and/or manual assembly techniques may then be used in assembling device structures 50 and 52 to form a gap such as gap 26 of FIG. 8 that is at partly filled with sealing material 56.

At step 106, equipment 96 and/or 97 of FIG. 8 may be used to apply material 94 such as water or other liquid, steam, oxygen, or other gases to material 56. When material 94 contacts sealing material 56, sealing material 56 swells in size to fill gap 26, as shown in FIG. 9.

Gasket structures may be used in sealing device gaps such as gap 26. Gasket structures may, for example, be formed from a sealing material that can be caused to swell (e.g., by adding a liquid that causes the sealing material to expand).

Figure 11:
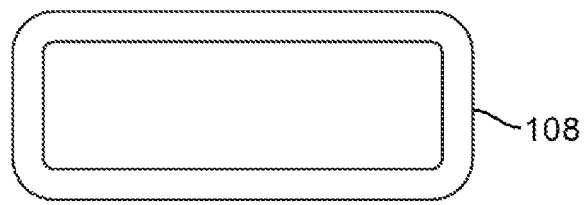
FIG. 11 is a top view of an illustrative rectangular gasket in accordance with an embodiment of the present invention.

An illustrative rectangular gasket of the type that may be used in sealing device structures in device 10 is shown in FIG. 11. As shown in FIG. 11, rectangular gasket 108 may have a rectangular outline with four edges.

Figure 12:
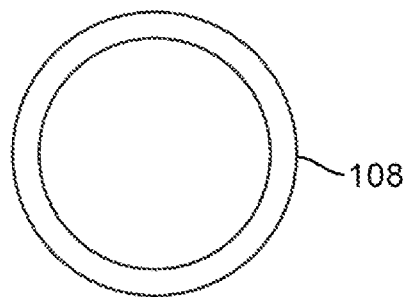
FIG. 12 is top view of an illustrative circular gasket in accordance with an embodiment of the present invention.

FIG. 12 shows how gasket 108 for sealing device structures in device 10 may be a circular ring-shaped gasket.

Figure 13:
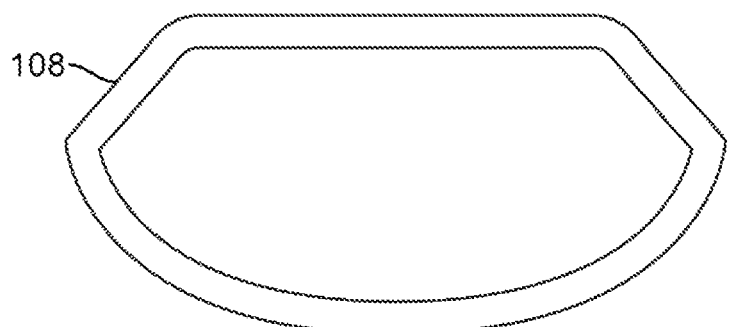
FIG. 13 is a top view of an illustrative gasket with a combination of curved and straight edges in accordance with an embodiment of the present invention.

If desired, gasket 108 may be provided with other suitable shapes such as shapes with combinations of curved and straight edges (see, e.g., FIG. 13).

Figure 14:
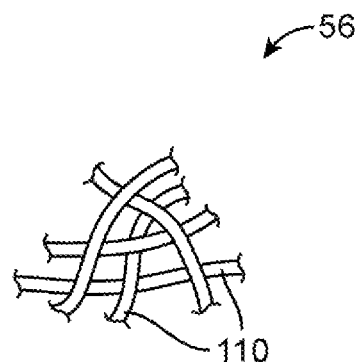
FIG. 14 is a diagram of illustrative sealing material of the type that may be used in filling gaps in electronic device structures in accordance with an embodiment of the present invention.
Figure 15:
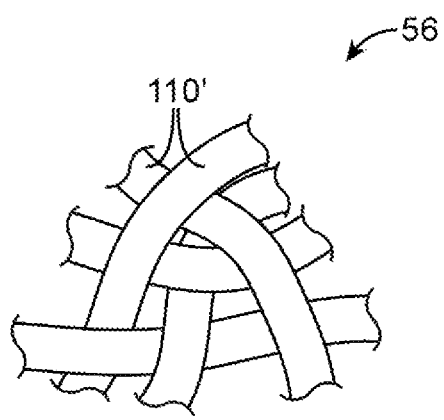
FIG. 15 is a diagram of the illustrative sealing material of FIG. 14 following application of a liquid or other material to promote swelling of the sealing material in accordance with an embodiment of the present invention.

Gaskets such as gaskets 108 of FIGS. 11, 12, and 13 may be formed from sealing material such as fiber-based sealing material 56 of FIG. 14. Sealing material 56 may include fibers such as fibers 110. Fibers 110 may be formed from plastic. For example, fibers 110 may be formed from a polymer material that swells when exposed to oil or other liquids. Following swelling, sealing material 56 may have an appearance of the type shown in FIG. 15 in which fibers 110 have become enlarged to form fibers 110'. The swollen size of material 56 of FIG. 15 relative to the size of material 56 of FIG. 14 may help sealing structures 56 expand to fill gap 26. Sealing material 56 may also be formed from other expandable polymer structures (e.g., polymer foam, polymer particles, etc.). The use of fiber-based structures for forming gaskets 108 is merely illustrative.

Figure 16:
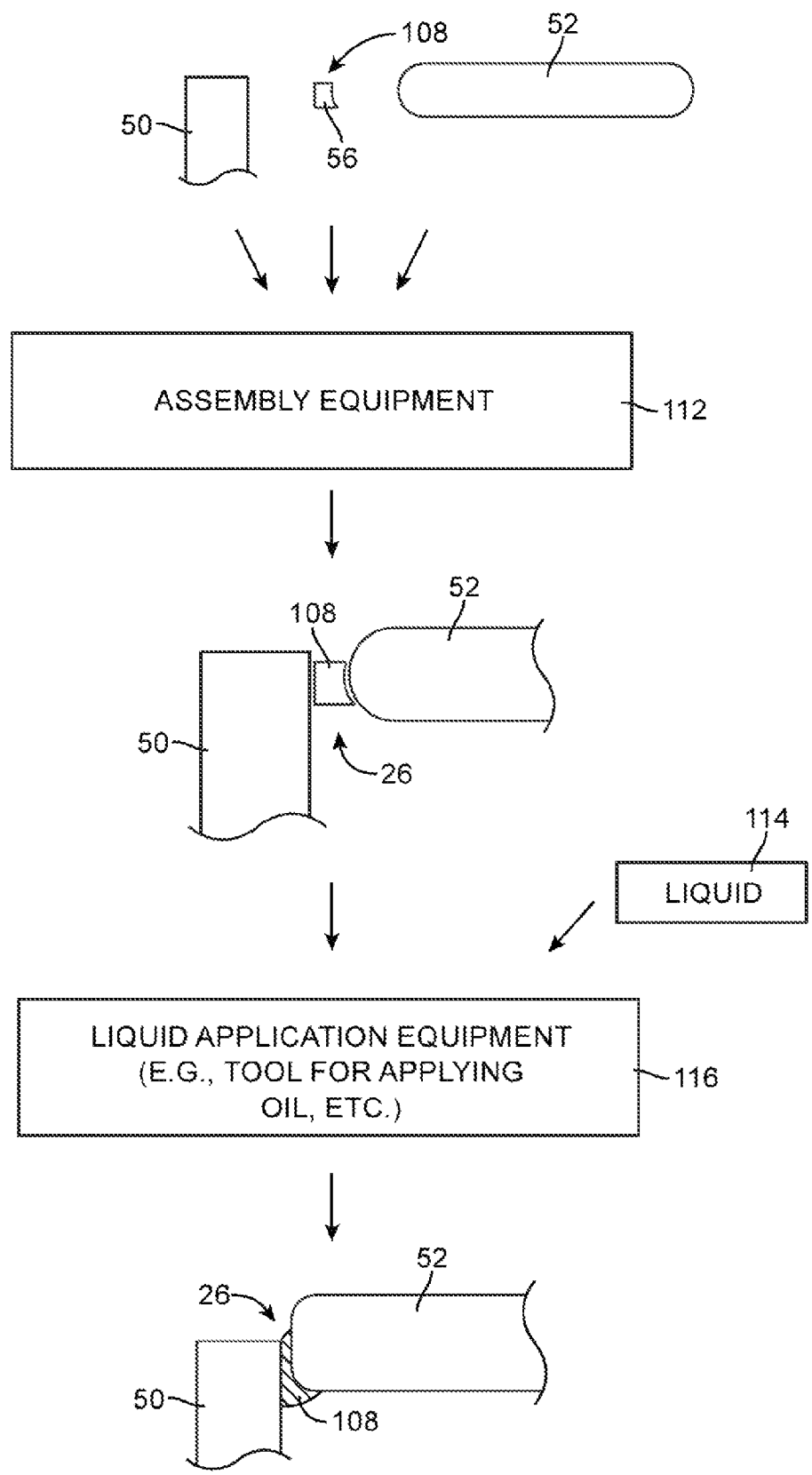
FIG. 16 is a diagram of a system in which a gap between electronic device structures is being filled using an undersized gasket of sealing material to which a liquid or other swelling-promoting material is being applied in accordance with an embodiment of the present invention.

FIG. 16 shows how a gasket formed from an expandable material such as polymer that swells when exposed to liquid or other material may be used in sealing gap 26.

Assembly equipment 112 may receive material such as electronic device structures 50 and 52. Assembly equipment 112 may also receive a gasket such as gasket 108. Gasket 108 may be formed from polymer fibers 110 (FIG. 14) or other material that is expandable to fill gap 26. The size of gasket 108 may initially be smaller than needed to fill gap 26 (i.e., gasket 108 may be undersized with respect to gap 26). Assembly equipment 112 may contain computer-controlled positioners and other robotic equipment for assembling device structures 50 and 52 and gasket 108. As shown in FIG. 16, once assembled, gasket 108 partly fills gap 26.

To swell gasket 108 and thereby completely fill gap 26, liquid 114 such as water or oil or other suitable material may be applied to gasket 108 by application tool 116. Tool 116 may include equipment for spraying or otherwise applying liquid 114 to gasket 108 such as a nozzle for dripping or spraying liquid 114, pad printing equipment, ink-jet printing equipment, screen printing equipment, or other tools for applying liquid 114 to gasket 108. Materials such as steam, oxygen, liquid 114, or other materials may also be applied to gasket 108 using a chamber such as chamber 97 of FIG. 8. When liquid 114 or other suitable material is a applied to gasket 108, fibers 110 of FIG. 14 or other material in gasket 108 may absorb liquid 114 or other material and may swell to fill gap 26 as shown in FIG. 16.

Figure 17:
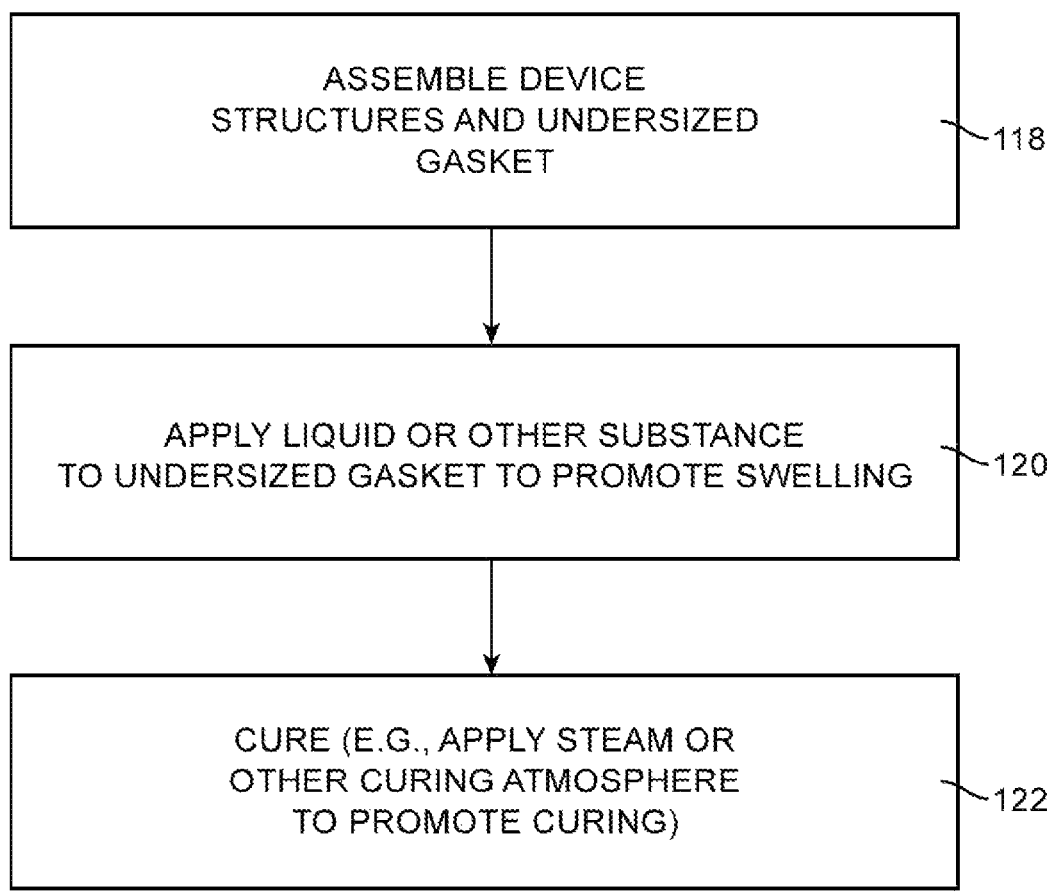
FIG. 17 is a flow chart of illustrative steps involved in filling a gap in electronic device structures by applying liquid or other material to an undersized gasket to promote swelling of the gasket in accordance with an embodiment of the present invention.

Illustrative steps involved in sealing device structure gaps such as gap 26 of FIG. 16 using an expandable gasket are shown in FIG. 17.

At step 118, device structures such as structures 50 and 52 may be assembled to form gap 26. In assembling device structures 50 and 52, gasket 108 may be placed within gap 26. Automated assembly equipment and manual assembly techniques may be used in performing the assembly operation of step 118. Gasket 108 is preferably undersized with respect to gap 26, thereby facilitating assembly and avoiding potential damage to gasket 108 due to shearing of portions of gasket 108 by structure 50 and/or structure 52.

At step 120, equipment such as equipment 116 of FIG. 16 or other suitable equipment (e.g., a chamber) may be used to apply liquid 114 or other material to gasket 108, causing gasket 108 to swell and fill gap 26. Once gap 26 has been filled, optional curing operations may be performed at step 122 (e.g., by applying light, heat, moisture, steam, or other curing atmosphere or materials to help stabilize the enlarged state of gasket 108 within gap 26).

The foregoing is merely illustrative of the principles of this invention and various modifications can be made by those skilled in the art without departing from the scope and spirit of the invention. The foregoing embodiments may be implemented individually or in any combination.

What is claimed is:

1. A method, comprising:
applying sealing material to a gap between a housing structure and a display layer, wherein the sealing material fills the gap and creates a protruding excess portion of the sealing material; and
removing the protruding excess portion of the sealing material using light-based processing equipment.

2. The method defined in claim 1 wherein the sealing material comprises a liquid polymer and wherein applying the sealing material to the gap comprises applying the liquid polymer to the gap.

3. The method defined in claim 2 further comprising curing the liquid polymer.

4. The method defined in claim 1 wherein removing the protruding excess portion comprises applying light to the protruding excess portion while the sealing material fills the gap.

5. The method defined in claim 1 wherein removing the protruding excess portion of the sealing material using the light-based processing equipment comprises focusing ultraviolet light on the protruding excess portion.

6. A method, comprising:
applying sealing material to a gap between first and second electronic device structures, wherein the sealing material fills the gap and creates a protruding excess portion of the sealing material; and
removing the protruding excess portion of the sealing material using light-based processing equipment, wherein removing the protruding excess portion comprises applying light to the protruding excess portion while the sealing material fills the gap, and wherein removing the protruding excess portion comprises applying a solvent to the protruding excess portion after applying the light to the protruding excess portion.

7. The method defined in claim 6 wherein removing the protruding excess portion comprises wiping away the protruding excess portion after applying the solvent and light to the protruding excess portion.

8. The method defined in claim 7 wherein the first electronic device structure comprises an electronic device housing structure and wherein applying the sealing material comprises applying the sealing material between the electronic device housing structure and the second electronic device structure.

9. The method defined in claim 8 wherein the second electronic device comprises a display cover layer and wherein applying the sealing material comprises applying the sealing material between the electronic device housing structure and the display cover layer.

10. A method, comprising:
applying sealing material to a gap between an housing structure and a display layer, wherein the sealing material partly fills the gap; and
expanding the applied sealing material to fill the gap, wherein a first portion of the sealing material contacts the housing structure and a second portion of the sealing material contacts the display layer after the applied sealing material is expanded.

11. The method defined in claim 10 wherein expanding the applied sealing material comprises applying a liquid to the sealing material.

12. The method defined in claim 11 wherein applying the sealing material comprises using a nozzle and computer-controlled positioner to apply an adhesive to the gap.

13. The method defined in claim 10 wherein expanding the applied sealing material comprises applying moisture to the sealing material.

14. The method defined in claim 10 wherein the electronic device structure includes an electronic device housing structure and wherein applying the sealing material to the gap comprises applying the sealing material between the electronic device housing structure and the display layer.

15. The method defined in claim 10 wherein applying the sealing material comprises applying a polymer adhesive and wherein expanding the applied sealing material comprises applying moisture to the polymer adhesive.

16. A method, comprising:
placing an undersized gasket in a gap between first and second electronic device structures; and
applying a material to the undersized gasket to expand the undersized gasket to fill the gap, wherein the undersized gasket comprises polymer fibers and wherein applying the material comprises applying a liquid to the polymer fibers that expands the polymer fibers.

17. The method defined in claim 16 wherein the first electronic device structure includes an electronic device housing structure and wherein placing the undersized gasket comprises placing the undersized gasket between the electronic device housing structure and the second electronic device structure.

18. The method defined in claim 17 wherein the second electronic device comprises a display cover layer and wherein placing the undersized gasket comprises placing the undersized gasket between the electronic device housing structure and the display cover layer.

19. The method defined in claim 16 wherein applying the liquid to the polymer fibers comprises applying oil to the polymer fibers.

20. A method, comprising:
applying sealing material to a gap between first and second electronic device structures, wherein the sealing material fills the gap and creates a protruding excess portion of the sealing material; and
removing the protruding excess portion of the sealing material using material removal equipment, wherein removing the protruding excess portion comprises applying solvent to the protruding excess portion while the sealing material fills the gap.

21. The method defined in claim 20 wherein the first electronic device structure comprises an electronic device housing structure and wherein applying the sealing material comprises applying the sealing material between the electronic device housing structure and the second electronic device structure.

22. The method defined in claim 21 wherein the second electronic device comprises a display cover layer and wherein applying the sealing material comprises applying the sealing material between the electronic device housing structure and the display cover layer.

* * * * *